US008902030B2

(12) United States Patent (10) Patent No.: US 8,902,030 B2
Aubert (45) Date of Patent: Dec. 2, 2014

(54) DEVICE FOR GENERATING AN ORIENTABLE AND LOCALLY UNIFORM MAGNETIC FIELD

(71) Applicant: Commissariat a l'energie Atomique et aux Energies Alternatives, Paris (FR)

(72) Inventor: Guy Aubert, Poiters (FR)

(73) Assignee: Commissariat a l'energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/105,711

(22) Filed: Dec. 13, 2013

(65) Prior Publication Data

US 2014/0167893 A1    Jun. 19, 2014

(30) Foreign Application Priority Data

Dec. 14, 2012    (FR) ...................................... 12 62070

(51) Int. Cl.
| | |
|---|---|
| H01F 5/00 | (2006.01) |
| G01R 33/38 | (2006.01) |
| G01R 33/3815 | (2006.01) |
| H01F 7/20 | (2006.01) |
| G01R 33/44 | (2006.01) |

(52) U.S. Cl.
CPC ................ H01F 7/202 (2013.01); G01R 33/38 (2013.01); G01R 33/3815 (2013.01); G01R 33/445 (2013.01)
USPC ............................ 335/299; 324/319; 324/320

(58) Field of Classification Search
USPC ............................ 335/216, 299; 324/319–320
See application file for complete search history.

(56) References Cited

U.S. PATENT DOCUMENTS

| | | | |
|---|---|---|---|
| 7,403,009 B2 | 7/2008 | Aubert | |
| 7,990,143 B2 | 8/2011 | Aubert | |
| 2002/0031201 A1 | 3/2002 | Suzuki et al. | |
| 2008/0024130 A1 | 1/2008 | Schlueter et al. | |

FOREIGN PATENT DOCUMENTS

| | | |
|---|---|---|
| WO | WO-2005/029110 A2 | 3/2005 |
| WO | WO-2007/048983 A2 | 5/2007 |

OTHER PUBLICATIONS

Cernak, J., et al.; "Aggregation of magnetic holes in a rotating magnetic field;" Physical Review E, vol. 78; dated 2008.
Ioffe, A., et al.; "Larmor labelling by thin spin flippers with rotating magnetic field; simulations of performance of neutron scattering instruments;" Nuclear Instruments and Methods in Physics Research A, vol. 529; pp. 45-49; dated 2004.
Preliminary Search Report for French Application No. 1262070; dated Oct. 18, 2013.

Primary Examiner — Ramon Barrera
(74) Attorney, Agent, or Firm — Alston & Bird LLP (57) ABSTRACT

Device for generating an orientable and locally uniform magnetic field, including N≥3 identical assemblies of cylindrical coils, each assemblies having a first and a second coil, the coils being coaxial with an axis oriented along a direction z and arranged symmetrically on either side of the plane, with a gap in the axial direction, the assemblies arranged such that their outlines in a plane xy perpendicular to the z-axis are regularly spaced along a circle of center O and of radius $a_0>0$, so to leave a central free space. A supply system supplies the coils with a current set to obtain, at the center of the device, a magnetic field having the desired orientation. The device may include two pairs of cylindrical coils having a common axis oriented in said z-direction and passing through the center of the circle, these coils being arranged symmetrically on either side of said xy-plane.

15 Claims, 4 Drawing Sheets

DEVICE FOR GENERATING AN ORIENTABLE AND LOCALLY UNIFORM MAGNETIC FIELD

CROSS REFERENCE TO RELATED APPLICATIONS

This application claims priority from French Application No. 12 62070, filed Dec. 14, 2012, which is hereby incorporated herein in its entirety by reference.

FIELD

The invention relates to a device for generating a magnetic field that is locally uniform, i.e. substantially uniform in a preset region of space, and orientable in three dimensions, or at least in a plane. The invention also relates to the use of such a device.

BACKGROUND

Certain scientific experiments, especially neutron diffraction or scattering, require a sample to be subjected to a magnetic field that is orientable in all the directions of space. The sample holder is a cryogenic chamber, which entails the field source comprising a free access usually a circular cylinder of vertical axis. A free space must also be arranged on either side of the horizontal plane passing through the sample, in order to allow the passage of neutron beams having a certain angular aperture. Lastly, the field generating system must remain stationary, the variable orientation of the field being obtained by adjusting supply currents.

Typically, it is desired to generate, in a 10 mm-diameter sphere, an orientable magnetic field having an amplitude of about 1 T and a uniformity of better than 5% or even 1%, while leaving an axial access that is at least 100 mm in diameter, and providing an equatorial angular aperture of about 2.5°.

Figure 1:
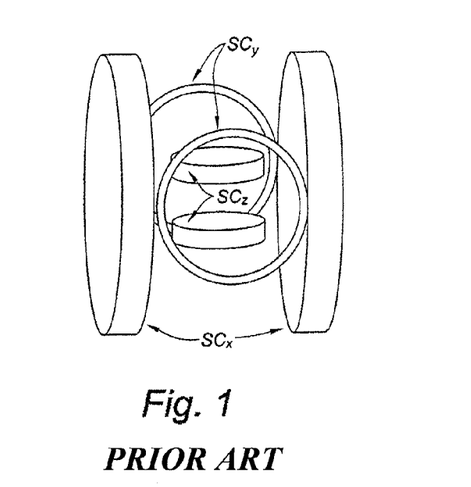
FIG. 1, a device for generating an orientable magnetic having three pairs of coaxial coils (or split coils) $SC_x$, $SC_y$, $SC_z$ the axes of which are orthogonal and cross at the centre of the sample.

An orientable magnetic field having the required amplitude and uniformity characteristics may be generated by means of the device in FIG. 1, which comprises three pairs of coaxial coils (or split coils) $SC_x$, $SC_y$, $SC_z$, the axes of which are orthogonal and cross at the centre of the sample. Such a device has been installed in the (British) ISIS muon and neutron source, allowing a magnetic field uniformity better than 0.5% to be obtained in a 10 mm-diameter sphere, but its angular aperture is very limited. In particular, it does not have a continuous equatorial aperture, but only relatively narrow accesses along the axes x, y and z.

A related problem is that of how to generate a rotating magnetic field (in a plane or a cone, i.e. having a rotating radial component and a constant axial component), rotating magnetic fields being important for nuclear magnetic resonance in particular. Accessibility requirements are also present in these applications. In the prior art (see for example document US 2008/0024130) a rotating magnetic field is obtained by making a magnet rotate, which poses problems with regard to complexity, reliability and vibrations.

SUMMARY

The invention aims to overcome the aforementioned drawbacks of the prior art by providing a device for generating an orientable and/or rotating and locally uniform magnetic field having both an axial access for easy insertion of a sample, and an equatorial angular aperture in order, for example, to allow beams of particles (especially neutrons) or radiation to pass.

The device of the invention has been developed to meet the needs of neutron diffraction and scattering studies, but may also be suitable for other applications such as X-ray scattering, nuclear magnetic resonance, static magnetometry (in particular SQUID/VSM and Kerr magneto-optic magnetometry) and maglev transportation systems.

Some embodiments furthermore allow a more uniform magnetic field to be obtained than was possible with prior-art solutions, and a lower maximum magnetic field, and comprise active shielding.

One subject of the invention is therefore a device for generating an orientable and locally uniform magnetic field, comprising N≥3 identical assemblies of cylindrical coils, each of said assemblies comprising at least a first and a second coil, said coils being coaxial with an axis oriented along a direction z and being arranged symmetrically on either side of said plane, with a gap in the axial direction, said assemblies being arranged such that their outlines in a plane xy perpendicular to said z-axis are regularly spaced along a circle of centre O and of radius $a_0 > 0$, so as to leave a central free space, the device also comprising a supply system configured to supply each of said coils with a current $I_n^i$, n being an index representing the coil assembly and i being equal to 1 for said first coils and to 2 for said second coils, expressed by the sum of a first term $I_z$ having a given value for all the coils, and a second term $I_{xy}$ equal to $(-1)^{i-1} \cdot I_0 \cdot \sin\theta_0 \cdot \cos(\phi_n - \phi_0)$, where $I_0$ is a nominal current, $\phi_n$ is the azimuthal angle, relative to a reference direction in the xy-plane, of the nth coil assembly, $\phi_0$ is the azimuthal angle, relative to the same reference direction, of a magnetic field to be generated in the centre of said circle by said coils, and $\theta_0$ is the zenith angle of the same magnetic field relative to the z-axis, at least the angle $\phi_0$ being adjustable by a user.

Advantageously:
The number N of coil assemblies may be even, and preferably chosen from 4 and 6.
Said first and second coils may be identical, except, at the very most, for their winding direction.
N may be an even number higher than or equal to 6 and the inside diameter $a_1$, the outside diameter $a_2$, the distance $b_1$ from the xy-plane, and the height $b_2 - b_1$ of said coils may be chosen so as to cancel out at least the 2nd order terms of the expansion in spherical harmonics of the components of said magnetic field inside an imaginary sphere located at the centre of said free space.
According to a first embodiment of the invention, said supply system is configured such that the component $I_z$ of the current supplying said first and second coils is $-I_0 \cos\theta_0$, and in which the inside diameter $a_1$, the distance $b_1$ from the xy-plane and the height $b_2$ of said coils are chosen such that the radial component $B_{\rho n}$ of the magnetic field generated by the nth coil assembly is equal to twice the axial component $B_{zn}$ of this field at said centre O.
According to a second embodiment of the invention, each of said assemblies also comprises a third and a fourth cylindrical coil coaxial with said first and second coils, and being arranged symmetrically on either side of said plane with a gap in the axial direction; said supply system is furthermore configured such that the component $I_z$ of the current supplying said first and second coils is zero and the current supplying said third and fourth coils of all the assemblies is $I_{3,4} = I_0 \cos\theta_0$. As a first variant of this second embodiment, said third and fourth coils are wound inside the first and second coils of the corresponding assemblies. As a second variant of this second embodiment, said third and fourth coils are remote further from the xy-plane than the first and second coils of the corresponding assemblies.

According to a third embodiment of the invention, the device also comprises a first and a second pair of coaxial cylindrical coils having a common axis oriented in said z-direction and passing through the centre of said circle, the coils being arranged symmetrically on either side of said xy-plane; said supply system is furthermore configured such that the component $I_z$ of the supply current of said first and second coils is zero; and currents flow through said two pairs of coils in opposite directions in each pair, the currents having values allowing both the dipolar magnetic moment outside of the device to be cancelled out, and the magnetic field generated by all the coils of the device at the centre of said circle to be oriented at a zenith angle $\theta_0$. Advantageously, the diameters, heights and axial positions of the coils of said two pairs may be chosen so as also to cancel out at least the 1st and 2nd order terms of the expansion in spherical harmonics of the component oriented in said z-direction of said magnetic field inside an imaginary sphere located at the centre of said free space. One of said pairs of coils may especially be arranged in the gap between said first and second coils, and the other pair is arranged externally to said first and second coils in said z-direction.

In a device according to said second or third embodiment of the invention, in which N is an even number, the first and second coils of the assemblies arranged symmetrically relative to the centre of said circle may be connected in series with one another and to a common current generator. This allows supply of the coils to be considerably simplified.

Said coils may have uniform average winding densities and be superconductive.

Said supply system may be configured to supply said first and second coils with a current varying sinusoidally over time, by way of which a rotating magnetic field is generated.

Another subject of the invention is the use of a device such as described above to generate an orientable or rotating magnetic field in said central free space.

BRIEF DESCRIPTION OF THE DRAWINGS

Other features, details and advantages of the invention will become apparent on reading the description given with reference to the appended drawings, provided by way of example, and which show, respectively:

FIGS. 7, 8 and 9A/9B, three devices according to the third embodiment of the invention.

DETAILED DESCRIPTION

One idea behind the invention consists in using a plurality of coaxial coils, regularly arranged along a circle, to generate a uniform magnetic field oriented in a radial direction (perpendicular to the axial direction), and optionally also an axial magnetic field the amplitude of which may be set independently of that of the radial magnetic field. From the structural point of view a device according to the invention resembles the coil assemblies used to generate axial magnetic field gradients in nuclear magnetic resonance imaging systems, as in particular disclosed in documents WO 2005/029110 and WO 2007/048983. It will be noted that in these documents it is a question of generating an axial magnetic field that is nonuniform (because it contains gradients), whereas the present invention in contrast aims to generate a uniform radial magnetic field (or a uniform magnetic field having a radial component). A device according to the invention therefore differs from a gradient coil assembly known from the prior art in the number of coils that it comprises, their size, the presence of additional coils (in certain embodiments) and in the structure and the operation of the system supplying current to said coils.

Figure 2:
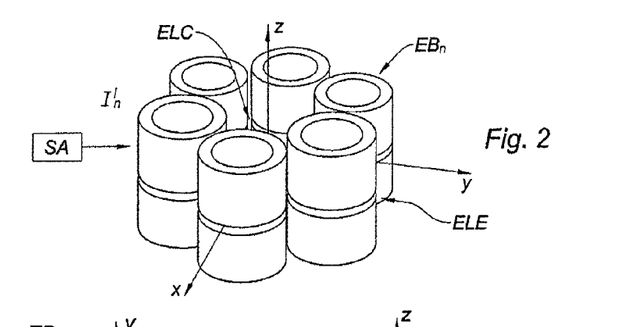
FIG. 2, a device according to the first embodiment of the invention, comprising 6 coil assemblies.
Figure 3A:
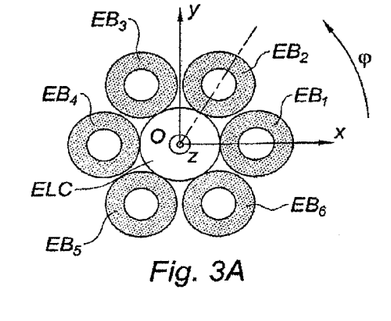
FIGS. 3A and 3B, two cross-sectional views of the device in FIG. 2.
Figure 3B:
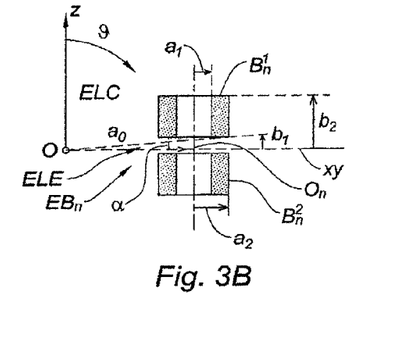

FIGS. 2 and 3A/3B illustrate a first embodiment of a device according to the invention. This device is made up of a plurality (here six) elements EB ($EB_1$-$EB_6$) of generally cylindrical shape (typically, but not necessarily, with a circular base) having axes that are parallel to one another in a direction that will be designated the z-direction. These elements are regularly distributed along a circle of radius $a_0$ located in a plane, which will be designated the xy-plane, perpendicular to said z-direction. The centre of the circle, which is chosen as the origin of the coordinates system Oxyz, will be designated O; the x-axis is arbitrarily chosen to pass through the centre of one of the elements EB ($EB_1$). The azimuthal coordinate $\phi_n$ of the element $EB_n$ is therefore given by:

$$\varphi_n = (n-1)\frac{2\pi}{N}, n = 1, \ldots, N$$

where N is the number of elements.

Each element consists of a coil assembly comprising two coaxial coils having axes oriented along the z-direction, and arranged symmetrically relative to the xy-plane. The coil of the element $EB_n$ that is located on the positive z-value side will be designated $B_n^1$ and that located on the negative z-value side $B_n^2$.

It is assumed, for the sake of simplicity, that all these coils are identical and characterized by an inside radius $a_1$, an outside radius $a_2$, ends located at distances $b_1$ and $b_2$ (where $0 < b_1 < b_2$) from the xy-plane, and therefore a height ($b_2-b_1$). Furthermore, it is assumed that the coils have windings of uniform density, and therefore a constant azimuthal current density j the value of which depends on the current flowing through the coil. These conditions may be relaxed but at the cost of increasing the complexity of the calculations required to dimension the device.

For given N, $a_0$ and $a_2$ are chosen such that the coils are sufficiently far apart, to allow for their structural elements (mandrels, supports, etc.), and such that the cylindrical central free space ELC corresponds to the specifications. The equatorial free space ELE, of width $2 b_1$, is chosen in accordance with the specifications for the equatorial angular aperture $\alpha$, the value of $a_2$ also being allowed for. Specifically, as may be seen in FIG. 3B, $\alpha = \tan^{-1}[b_1/(a_0+a_2)]$.

Two specifications are particularly important for defining the geometry of the system, the radius $\rho_0$ of the axial free aperture ELC, and the minimum gap $2d_0$ between the external surfaces of two neighbouring coils, dictated by the bulk of the mandrels and supports. The following two conditions must therefore be respected:

$$a_0 \geq a_2 + \rho_0$$

$$a_0 \geq \frac{a_2 + d_0}{\sin\frac{\pi}{N}}$$

In the extreme case where the equality applies in both the above relationships, and therefore the projections of the coils onto the xy-plane are circles that are tangent to the circle of centre O and of radius $\rho_0$, and spaced apart from each other by a distance $2d_0$, the values of $a_0$ (which will be referred to as $a_{00}$) and of $a_2$ (which will be referred to as $a_{20}$) are given by:

$$a_{00} = \frac{\rho_0 - d_0}{1 - \sin\frac{\pi}{N}}$$

$$a_{20} = \frac{\rho_0 \sin\frac{\pi}{N} - d_0}{1 - \sin\frac{\pi}{N}}$$

If, for example, $\rho_0$ is set to $\rho_0$=60 mm (set depending on the envisaged application) and $2d_0$=6 mm (technological constraint), it is found that, for the cases where N=4 and N=6:

$$\begin{bmatrix} \rho = 60 \text{ mm}_0 \\ 2d_0 = 6 \text{ mm} \end{bmatrix} \rightarrow \begin{bmatrix} N & a_{00} & a_{20} \\ 4 & 194.61 \text{ mm} & 134.61 \text{ mm} \\ 6 & 114 \text{ mm} & 54 \text{ mm} \end{bmatrix}$$

In the case where N=4 the value of $a_0$ may be chosen such that $a_0$=146 mm<$a_{00}$. The value of $a_2$ is then constrained by the first of the above inequalities: $a_2 \leq a_0 - \rho_0$=86 mm. This value is smaller than $a_{20}$=134.61 mm, meaning that the second inequality is "inactive" because the gap between the coils is larger than $2d_0$. In contrast, in the case where N=6, it is the second inequality that places an upper limit on the value of $a_2$, whereas the first inequality is "inactive".

The height ($b_2-b_1$), the inside diameter $a_1$ and the current density j of the coils are set so as to obtain a magnetic field that has the required amplitude and orientation at the point O, and that is substantially uniform (nonuniformity less than or equal to 5%, preferably less than or equal to 1%, and even more preferably less than 10 ppm, i.e. 10 parts per million) in a sphere of preset radius, for example 10 mm, centred on O.

For the field calculations, it is enough to know the expressions of the axial component $B_{zn}$ and of the radial component $B_{\rho n}$ of the field of a magnet having a uniform azimuthal current density $j_n$ and a rectangular axial half-section ($a_1$, $a_2$, $b_1$, $b_2$) in its own reference frame, and to sum them vectorially. Known analytical formulae and software codes allow these calculations to be performed rapidly and with a precision guaranteed to be better than one part per billion (ppb).

It has been demonstrated that, to generate a magnetic field oriented in the z-direction, it is necessary for all the current densities (and therefore all the currents, assuming identical coils) to be identical and for:

$$B_{zn}(j_n, \rho_n = a_0, z_n = 0) = \frac{B_0}{2N} \quad (1)$$

where $B_0$ is the nominal amplitude of the generated field and $\rho_n$, $z_n$ are the radial and axial coordinate, respectively, of a point in the reference frame of the nth assembly, the centre $O_n$ of which is given by the intersection of the axis of the coils forming it with the xy-plane. The coordinates $\rho_n$=$a_0$, $z_n$=0 correspond to the point O, i.e. to the centre of the device.

To generate a magnetic field in the xy-plane, oriented in the azimuthal direction $\phi_0$, it is necessary for N to be at least equal to 3, and the current densities must be given by:

$$j_n = \pm j_0 \cos(\phi_n - \phi_0) \quad (2)$$

the "+" sign applying to coils located on the positive z-value side and the "−" sign to those located on the negative value side. Thus:

$$B_0 = NB_{\rho n}(j_0, \rho_n = a_0, z_n = 0) \quad (3)$$

In order for it to be possible to generate a magnetic field having an arbitrary direction in space, it is necessary to choose $a_1$, $b_1$ and $b_2$ such that the following condition is satisfied:

$$B_{\rho n}(j_0, \rho_n = a_0, z_n = 0) = 2B_{zn}(j_0, \rho_n = a_0, z_n = 0) \quad (4)$$

where $\rho_n$ and $z_n$ have been defined above and the component $B_{\rho n}$ is calculated for a coil with $z_n$>0, which is always possible because $B_{zn}$ and $B_{\rho n}$ vary inversely as a function of $b_2$. It is also necessary for $a_1$>$a_{min}$, due to technological constraints, and for the generated field to have the required uniformity property. As will be explained below, the other geometrical parameters may, advantageously but not exclusively, be set by a semi-analytical calculation based on an expansion of the magnetic field in spherical harmonics, so as to maximize the uniformity of said field, or even to optimize another target function while ensuring satisfactory magnetic-field uniformity.

From equation (2) it is found that, to generate a magnetic field of amplitude $B_0$, of zenith angle $\theta_0$ (relative to the z-axis) and of azimuthal angle $\phi_0$, the two coils of the element $EB_n$ must be supplied with a current:

$$I_n^i = I_0 \cdot [-\cos\theta_0 + (-1)^{i-1} \sin\theta_0 \cos(\phi_n - \phi_0)] \quad (5)$$

where i=1 for coils located on the positive side of the z-axis and i=2 for coils located on the negative side of said axis. This implies that each coil has an independent supply. FIG. 2 schematically shows a supply system SA comprising 2N=12 current generators suitably controlled by a computer program. The user inputs, by means of a graphical interface, the desired values of the angles $\theta_0$ and $\phi_0$ and of the amplitude $B_0$, then the computer calculates the twelve currents $I_n^i$ by applying equation (5) and controls the current generators accordingly.

Figure 4A:
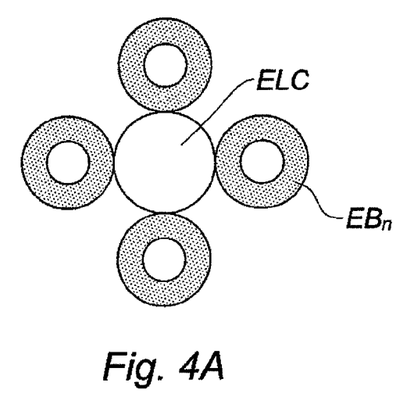
FIGS. 4A and 4B, two cross-sectional views of a device according to said first embodiment of the invention, comprising only 4 coil assemblies.
Figure 4B:
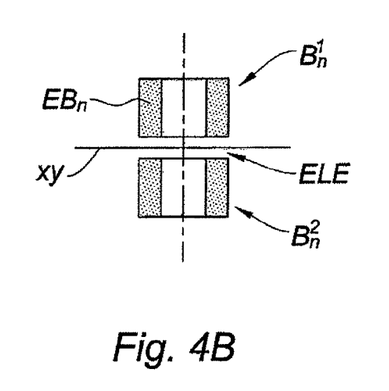

Two configurations, given by way of example, will now be considered, the first for N=6 (FIGS. 2 and 3A/3B) and the second for N=4 (FIGS. 4A and 4B). In both cases, it is a question of generating a magnetic field of amplitude $B_0$=1 T, and the superconductive coils are able to withstand a maximum current density $j_0$=300 A/cm$^2$.

Configuration No. 1
The parameters set a priori are:
N=6
$a_0$=150 mm
$a_2$=70 mm
$b_1$=15 mm Equation (4) allows $a_1$ and $b_1$ to be calculated (numerically) giving: $a_1=50.6925$ mm and $b_1=113.3675$ mm. To ensure a certain magnetic-field margin (i.e. in order to generate, with $j=j_0$, a magnetic field having an amplitude slightly larger than that required) $a_1$ is chosen such that $a_1=50$ mm; equation (4) then requires that $b_1=113.5$ mm. Therefore:

$a_1=50$ mm
$b_1=113.5$ mm.

The maximum amplitude of the magnetic field produced is $B_0=1.02462$ T and the total coil volume is 8.912 dm$^3$. $2N=12$ independent supplies are required.

For $N=4$ (after the values of $a_1$ and $b_1$ have been adjusted as in the first example) the following are obtained:

$N=4$
$a_0=205$ mm
$a_2=135$ mm
$b_1=25$ mm
$a_1=120$ mm
$b_1=112.2343$ mm.

The total coil volume is 8.386 dm$^3$. $2N=8$ independent supplies are required.

In order to evaluate these two configurations, the magnetic-field uniformities obtained for two extreme situations, i.e. a field parallel to Oz or a field parallel to Ox, will be compared. The main component of the field is evaluated at a number of points on a reference sphere of radius $r_0=10$ mm, and the coefficients of its spherical harmonics expansion (SHE) are calculated by computer.

These expansions are written:

$$B_z = B_0\left\{1+\sum_{n=1}^{\infty}\left(\frac{r}{r_0}\right)^n\left[Zz_nP_n(\cos\vartheta)+\sum_{n=1}^{\infty}(Xz_n\cos m\varphi+Yz_n\sin m\varphi)W_n^m P_n^m(\cos\vartheta)\right]\right\} \quad (6)$$

for the component $B_z$, where $$W_n^m = \frac{(n-m-1)!!}{(n+m-1)!!} \quad (7)$$

and $$B_x = Zx_0+\sum_{n=1}^{\infty}r^n\left[Zx_nP_n(\cos\vartheta)+\sum_{m=1}^{n}(Xx_n^m\cos m\varphi+Yx_n^m\sin m\varphi)P_n^m(\cos\vartheta)\right]$$

for the component $B_x$.

$P_n$ and $P_n^m$ are nth-degree Legendre polynomials and the associated nth-degree and mth-order Legendre functions, respectively, whereas $Zz_n$, $Xz_n^m$, $Yz_n^m$, $Zx_n$, $Xx_n^m$, $Yx_n^m$ are coefficients to be determined.

For the first configuration ($N=6$), the coefficients $Zz_n$, $Xz_n^m$, $Yz_n^m$ of the SHE of $B_z$ are given in the following table:

| | | | | |
|---|---|---|---|---|
| 0: 1.024619 | | | | |
| 1: 0.000 | 1: 0.000 | | | |
| | 1: 0.000 | | | |
| 2: 6153.142 | 1: 0.000 | 2: 0.000 | | |
| | 1: 0.000 | 2: 0.000 | | |
| 3: 0.000 | 1: 0.000 | 2: 0.000 | 3: 0.000 | |
| | 1: 0.000 | 2: 0.000 | 3: 0.000 | |
| 4: −202.190 | 1: 0.000 | 2: 0.000 | 3: 0.000 | 4: 0.000 |
| | 1: 0.000 | 2: 0.000 | 3: 0.000 | 4: 0.000 |
| 5: 0.000 | 1: 0.000 | 2: 0.000 | 3: 0.000 | 4: 0.000 |
| | 1: 0.000 | 2: 0.000 | 3: 0.000 | 4: 0.000 |
| 6: 2.202 | 1: 0.000 | 2: 0.000 | 3: 0.000 | 4: 0.000 |
| | 1: 0.000 | 2: 0.000 | 3: 0.000 | 4: 0.000 |
| 7: −0.001 | 1: 0.000 | 2: 0.004 | 3: 0.000 | 4: 0.000 |
| | 1: 0.000 | 2: 0.000 | 3: 0.000 | 4: 0.000 |
| 8: −0.023 | 1: 0.000 | 2: 0.000 | 3: 0.000 | 4: 0.000 |
| | 1: 0.000 | 2: 0.000 | 3: 0.000 | 4: 0.000 | where the first column indicates the degree n followed by $Z_n$ in ppm, followed, on the same line, by the order m and $X_n^m$, the line immediately below giving the order m and $Y_n^m$ in ppm.

The coefficients $Zx_n$, $Xx_n^m$, $Yx_n^m$ of the SHE of $B_x$ are given in the following table:

| | | | | |
|---|---|---|---|---|
| 0: 1.024622 | | | | |
| 1: 0.000 | 1: 0.000 | | | |
| | 1: 0.000 | | | |
| 2: −19042.253 | 1: 0.000 | 2: 4760.563 | | |
| | 1: 0.000 | 2: 0.000 | | |
| 3: 0.000 | 1: 0.000 | 2: 0.000 | 3: 0.000 | |
| | 1: 0.000 | 2: 0.000 | 3: 0.000 | |
| 4: 119.483 | 1: 0.000 | 2: −59.742 | 3: 0.000 | 4: 99.280 |
| | 1: 0.000 | 2: 0.000 | 3: 0.000 | 4: 0.000 |
| 5: 0.000 | 1: 0.000 | 2: 0.000 | 3: 0.000 | 4: 0.000 |
| | 1: 0.000 | 2: 0.000 | 3: 0.000 | 4: 0.000 |
| 6: −0.588 | 1: 0.000 | 2: 0.368 | 3: 0.000 | 4: −0.745 |
| | 1: 0.000 | 2: 0.000 | 3: 0.000 | 4: 0.000 |
| 7: 0.000 | 1: 0.000 | 2: −0.001 | 3: 0.000 | 4: 0.000 |
| | 1: 0.000 | 2: 0.000 | 3: 0.000 | 4: 0.000 |
| 8: 0.002 | 1: 0.000 | 2: −0.002 | 3: 0.000 | 4: 0.004 |
| | 1: 0.000 | 2: 0.000 | 3: 0.000 | 4: 0.000 | where the first column indicates the degree n followed by $Zx_n$ in ppm, followed, on the same line, by the order m and $Xx_n^m$, the line immediately below giving the order m and $Yx_n^m$ in ppm.

It may be seen that for both components, the uniformity is governed by $Z_2$ ($Zx_2$) and that it is worse for the component $B_x$. However 20000 ppm of $Zx_2$ with $r_0=10$ mm leads to only 0.5% uniformity in a 10 mm-diameter reference sphere, which is well within the specifications. Moreover, the component $B_z$ comprises no non-axial $X_{zn}^m$, $Y_{zn}^m$ term for $m\leq 6$, whereas the component $B_x$ contains significant $Xx_{2p}^{2q}$ terms.

It has been demonstrated that N must be even in order to cancel out $Xx_{2p+1}^{2q+1}$ terms. For this reason, N is generally chosen to be even.

It should be noted that a satisfactory uniformity was obtained even though coil size and supply current were calculated without applying any specific constraints.

For the second configuration ($N=4$), for the component $B_z$ the following is obtained:

| | | | | |
|---|---|---|---|---|
| 0: 1.091009 | | | | |
| 1: 0.000 | 1: 0.000 | | | |
| | 1: 0.000 | | | |
| 2: 12437.599 | 1: 0.000 | 2: 0.000 | | |
| | 1: 0.000 | 2: 0.000 | | |
| 3: 0.000 | 1: 0.000 | 2: 0.000 | 3: 0.000 | |
| | 1: 0.000 | 2: 0.000 | 3: 0.000 | |
| 4: −292.464 | 1: 0.000 | 2: 0.000 | 3: 0.000 | 4: −72.985 |
| | 1: 0.000 | 2: 0.000 | 3: 0.000 | 4: 0.000 |
| 5: 0.000 | 1: 0.000 | 2: 0.000 | 3: 0.000 | 4: 0.000 |
| | 1: 0.000 | 2: 0.000 | 3: 0.000 | 4: 0.000 |
| 6: 2.824 | 1: 0.000 | 2: 0.000 | 3: 0.000 | 4: 2.079 |
| | 1: 0.000 | 2: 0.000 | 3: 0.000 | 4: 0.000 |

-continued

| 7: −0.001 | 1: 0.000 | 2: 0.000  | 3: 0.000 | 4: 0.000  |
|           | 1: 0.000 | 2: 0.000  | 3: 0.000 | 4: 0.000  |
| 8: −0.019 | 1: 0.000 | 2: 0.000  | 3: 0.000 | 4: −0.019 |
|           | 1: 0.000 | 2: 0.000  | 3: 0.000 | 4: 0.000  | and for the component $B_x$:

| 0: 1.091009    |          |             |          |           |
| 1: 0.000       | 1: 0.000 |             |          |           |
|                | 1: 0.000 |             |          |           |
| 2: −16297.492  | 1: 0.000 | 2: 14070.148|          |           |
|                | 1: 0.000 | 2: 0.000    |          |           |
| 3: 0.000       | 1: 0.000 | 2: 0.000    | 3: 0.000 |           |
|                | 1: 0.000 | 2: 0.000    | 3: 0.000 |           |
| 4: 53.007      | 1: 0.000 | 2: −91.394  | 3: 0.000 | 4: 49.605 |
|                | 1: 0.000 | 2: 0.000    | 3: 0.000 | 4: 0.000  |
| 5: 0.000       | 1: 0.000 | 2: 0.000    | 3: 0.000 | 4: 0.000  |
|                | 1: 0.000 | 2: 0.000    | 3: 0.000 | 4: 0.000  |
| 6: 0.583       | 1: 0.000 | 2: −0.726   | 3: 0.000 | 4: 0.122  |
|                | 1: 0.000 | 2: 0.000    | 3: 0.000 | 4: 0.000  |
| 7: 0.000       | 1: 0.000 | 2: 0.001    | 3: 0.000 | 4: −0.001 |
|                | 1: 0.000 | 2: 0.000    | 3: 0.000 | 4: 0.000  |
| 8: −0.015      | 1: 0.000 | 2: 0.023    | 3: 0.000 | 4: −0.012 |
|                | 1: 0.000 | 2: 0.000    | 3: 0.000 | 4: 0.000  |

It will be noted that the uniformity is substantially worse than for the configuration with N=6, especially because of the term $Xx_2^2$, which is nonzero. However, another parameter must be taken into consideration: the maximum value of the magnetic field inside the coil (peak field); this is particularly important in the case of superconductive coils, because, in this case, this maximum value must not exceed a threshold that is dependent on the superconductor used. In this respect, for N=6 this value has been found to be 5.75 T when a field is generated parallel to the z-direction, and is localized to the inside radius furthest from the centre of each coil. For N=4, the maximum magnetic field is less strong and is only 3.75 T, which may lead to this configuration being chosen for certain applications. It is possible to show, if N is chosen such that N>6, that uniformity increases but the maximum magnetic field also increases (for example it exceeds 9 T for N=9). It is also necessary to consider that the complexity of the supply system of the coils depends on N. For these reasons, configurations with N=4 and N=6 are generally preferred. A configuration with N=6 provides better uniformity, whereas a configuration with N=4 decreases the maximum value of the magnetic field and allows a simpler supply system to be used (8 independent current generators instead of 12).

It is possible to relax the conditions on the uniformity and the maximum value of the magnetic field in order to minimize the volume of the conductors, while respecting the bulk constraints given above ($\rho_0$=60 mm, $d_0$=6 mm), and with $B_0$=1 T, $j_0$=300 A/mm². Thus:

| N | $a_0$ | $a_1$   | $a_2$ | $b_1$ | $b_2$  | V     | PF    | %@$r_0$ = 10 mm |
|---|-------|---------|-------|-------|--------|-------|-------|-----------------|
| 4 | 146   | 65.529  | 86    | 20    | 88.696 | 5.356 | 5.124 | 3.7             |
| 6 | 114   | 27.094  | 54    | 15    | 80.884 | 5.419 | 7.322 | 2.5             | where %@$r_0$=10 mm is the nonuniformity in a sphere of 10 mm radius centred on the point O. The dimensions $a_i$, $b_i$ are in mm, V is in dm³, and PF is the maximum value of the magnetic field, in Tesla. Here, and in all the following examples, integer figures correspond to values fixed a priori, such as geometric constraints for example, whereas those with decimals result from an optimization.

The dimensioning of the device is thus decreased by solving a non-linear optimization problem with boundary conditions (resulting from the geometrics accessibility requirements) and non-linear constraints (magnetic field produced, elimination of certain coefficients of the spherical harmonics expansion in order to ensure uniformity). The target function to be optimized (minimized) may be the volume of the coils, particularly in the case where they are made of a superconductor, or their resistance, in the case where the coils are not superconductive.

It should be noted that when the equatorial angular aperture is fixed, increasing $a_2$ implies an increase in $b_1$, which in turn increases the conductor volume required.

It may be demonstrated that, in spherical coordinates, the scalar potential $V^*$ (the gradient of which multiplied by $-\mu_0$ gives the magnetic field) and $B_x$ are given by the following equations:

$$V^* = \frac{1}{\mu_0} \sum_{n=1}^{\infty} r^n \left[ Z_n P_n(\cos\vartheta) + \sum_{m=1}^{n} (X_n^m \cos m\varphi + Y_n^m \sin m\varphi) P_n^m(\cos\vartheta) \right]$$

$$B_x = Zx_0 + \sum_{n=1}^{\infty} r^n \left[ Zx_n P_n(\cos\vartheta) + \sum_{m=1}^{n} (Xx_n^m \cos m\varphi + Yx_n^m \sin m\varphi) P_n^m(\cos\vartheta) \right]$$

where:

$$Xx_n^1 = Z_{n+1} - \frac{(n+2)(n+3)}{2} X_{n+1}^2 \ \forall \ n \geq 1$$

$$Xx_n^m = \frac{1}{2} X_{n+1}^{m-1} - \frac{(n+m+1)(n+m+2)}{2} X_{n+1}^{m+1} \ \forall \ n \geq 2,\ 2 \leq m \leq n$$

$$Yx_n^1 = -\frac{(n+2)(n+3)}{2} Y_{n+1}^2 \ \forall \ n \geq 1$$

$$Yx_n^m = \frac{1}{2} Y_{n+1}^{m-1} - \frac{(n+m+1)(n+m+2)}{2} Y_{n+1}^{m+1} \ \forall \ n \geq 2,\ 2 \leq m \leq n$$

$$Zx_n = -\frac{(n+1)(n+2)}{2} X_{n+1}^1 \ \forall \ n \geq 0$$

If only terms of the lowest degree, i.e. those that are of interest when modelling the system generating the component $B_{xy}$, are focused on it is found that:

$$Zx_0 = -\frac{\mu_0 j_0}{a_0} \left\{ \int_{a_1}^{a_2} \left[ \frac{a_0^2 + a^2 + b^2}{r_1} K(k) - r_1 E(k) \right] da \right\}_{b_1}^{b_2} ;$$

$$Zx_2 = -\frac{\mu_0 j_0}{2a_0} \times$$

$$\left\{ \int_{a_1}^{a_2} \left[ \frac{[(a_0^2 - a^2)^2 + (a_0^2 + a^2)b^2] K(k)(a_0^2 - a^2)(a_0^2 + a^2) + 2[(a_0^2 - a^2)^2 - 4a_0^2 a^2]b^2 + (a_0^2 + a^2)b^4}{r_2^2} E(k) \right] \frac{da}{r_1^3 r_2^2} \right\}_{b_1}^{b_2}$$

and $$Xx_2^2 = -\frac{\mu_0 j_0}{12 a_0^3} \times$$

-continued $$\left\{ \int_{a_1}^{a_2} -\frac{\begin{bmatrix} \begin{bmatrix} (a_0^2 - a^2)^2(a_0^2 + 4a^2) + (7a_0^4 + \\ 3a_0^2 a^2 + 12a^4)b^2 + 2(5a_0^2 + 6a^2)b^4 + 4b^6 \end{bmatrix} K(k) \\ \begin{bmatrix} (a_0^2 - a^2)^2(a_0^4 - 7a_0^2 a^2 + 4a^4) + 8(a_0^6 - \\ 2a_0^2 a^4 + 2a^6)b^2 + (17a_0^4 + 13a_0^2 a^2 + \\ 24a^4)b^4 + 2(7a_0^2 + 8a^2)b^6 + 4b^8 \end{bmatrix} E(k) \end{bmatrix}}{r_2^2} \frac{da}{r_1^3 r_2^2} \right\}_{b_1}^{b_2}$$

where:

$$k = \frac{2\sqrt{a_0 a}}{r_1}$$

$$r_1 = \sqrt{(a_0 + a)^2 + b^2}$$

$$r_2 = \sqrt{(a_0 - a)^2 + b^2}$$

and where $K(k)$ and $E(k)$ are complete Legendre elliptical integrals, of the first and second kind respectively.

Using these formulae, values of $a$, $a_2$, $b_1$ and $b_2$ may be chosen that cancel out the lowest-degree terms that are not necessarily zero for reasons of symmetry, i.e. $Zx_2$ et $Xx_2^2$. It has been shown that for N=4 it is not possible to cancel them out simultaneously, whereas for N=6 the term $Xx_2^2$ is zero for reasons of symmetry, and all that is required is to choose geometric parameters that cancel out $Zx_2$. Thus, nonuniformities of about a few ppm are obtained at the price of a significant increase (of about a factor of two) in conductor volume.

When a device according to the first embodiment of the invention is used to generate, about the point O, a magnetic field having a nonzero $B_z$ component, an external magnetic field (leakage field) is also obtained, the strength of which increases as the amplitude of $B_z$, and therefore the dipolar magnetic moment, increases.

If such a leakage field is considered to be disadvantageous, it may be decreased, either by active shielding by means of additional coils, or by passive shielding with soft iron. In the present case, active shielding would lead to a complexity and bulk that would be acceptable only with difficulty. Passive shielding may be achieved by inserting the system into two circular, soft iron half-cylinders of axis Oz, which half-cylinders are separated by the necessary gap to ensure the required equatorial aperture, and closed by two bases, the upper base being equipped with a circular aperture in order to ensure axial accessibility. The main drawback of such shielding lies in the fact that it is impossible to model with precision, meaning that, on the one hand, the currents that must be supplied to the coils to obtain a given field intensity and direction must be calibrated experimentally, and on the other hand, that obtaining the desired uniformity is made considerably more complicated.

The main drawback of the first embodiment of the invention, which was just described, results from the complexity of its supply system SA, which comprises 2N (therefore, in practice, 8 or 12) independently controlled current generators. The second embodiment of the invention makes it possible to considerably simplify said supply system. According to this second embodiment, each element $EB_n$ comprises (at least) four coaxial coils: the aforementioned coils $B_n^1$ and $B_n^2$, which are used only to generate the radial component of the magnetic field, and coils $B_n^3$ and $B_n^4$—also arranged symmetrically on either side of the xy-plane—which are used only to generate the axial component of the magnetic field. Equation (5) shows that one and the same current $I_0 \cos \theta_0$ (which will be called the $I_z$ component) flows through both of the coils $B_n^3$ and $B_n^4$, whereas the current flowing through the coils $B_n^1$ and $B_n^2$ (which will be called the $I_{xy}$ component) is $(-1)^{i-1} \cdot I_0 \cdot \sin \theta_0 \cdot \cos(\phi_n - \phi_0)$. It will be noted that the coils $B_n^1$ and $B_n^2$ of a given assembly may be connected in series opposition, and that two assemblies arranged symmetrically about the point O (or the z-axis) may be connected in series. The number of generators required is therefore (N/2+1): N/2 generators for the coils $B_n^1$ et $B_n^2$, in groups of four, and only a single generator for all the coils $B_n^3$ and $B_n^4$. Specifically, the number of generators required passes from eight to three for N=4 and from twelve to four for N=6.

Figure 5A:
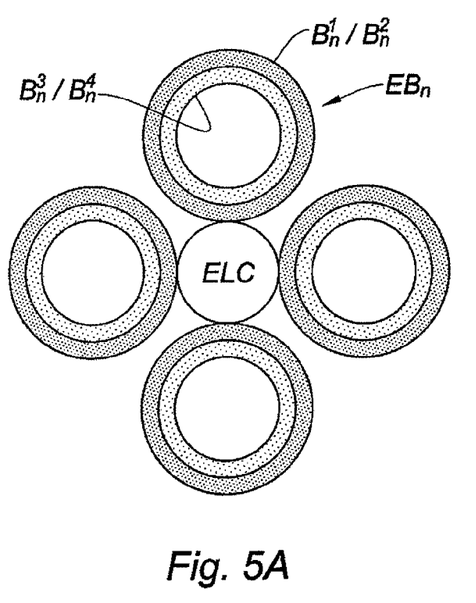
FIGS. 5A and 5B, two cross-sectional views of a device according to the first variant of the second embodiment of the invention, comprising 4 coil assemblies.
Figure 5B:
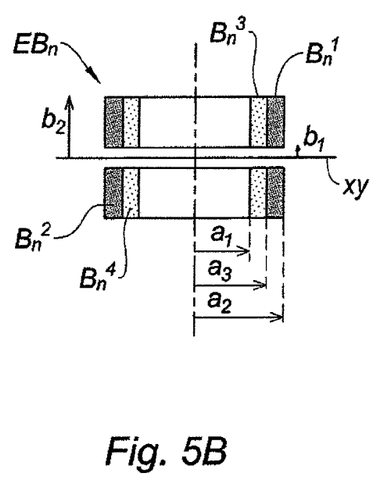
Figure 6A:
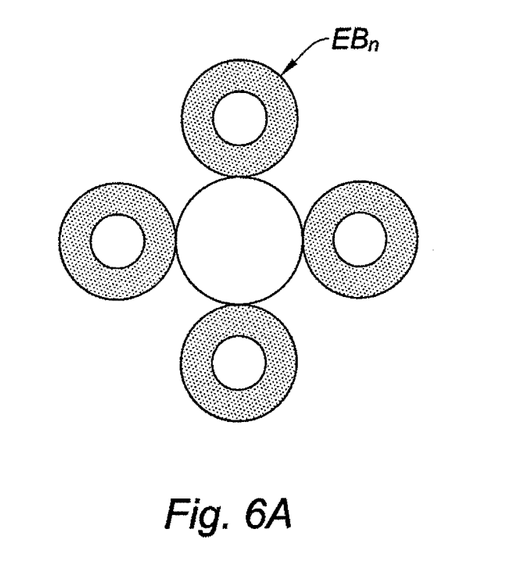
FIGS. 6A and 6B, two cross-sectional views of a device according to the second variant of the second embodiment of the invention, comprising 4 coil assemblies.
Figure 6B:
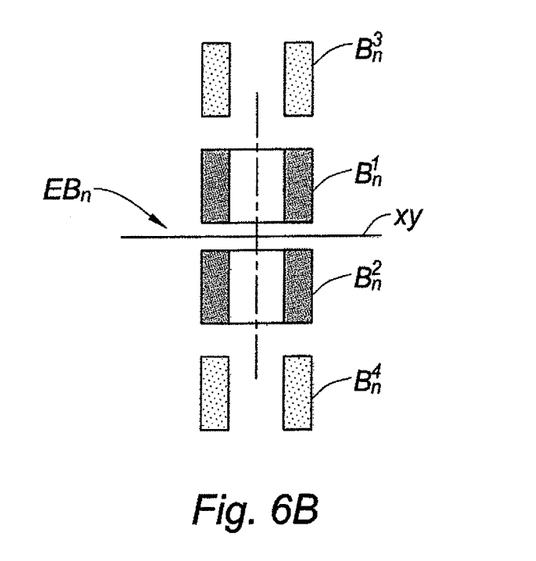

The coils $B_n^3$ and $B_n^4$ may be wound inside the corresponding coils $B_n^1$ and $B_n^2$ (FIGS. 5A/5B) or be further removed from the xy-plan than the latter (FIGS. 6A/6B). The figures show configurations comprising 4 elements, but the second embodiment also applies to configurations comprising 6 or more elements.

The simplification of the supply system obtained by virtue of the second embodiment comes at a price, namely a substantial increase in the volume of conductor and an increase in the maximum value of the magnetic field.

The solution that minimizes the volume of the conductor is the following:

| N | $a_0$ | $a_1$ | $a_3$ | $a_2$ | $b_1$ | $b_2$ | V |
|---|-------|-------|-------|-------|-------|-------|---|
| 4 | 173 | 71.160 | 94.113 | 113 | 20 | 79.531 | 11.528 | where $a_3$ is the separation radius of the internal and external coils (in other words, the first and second coils, generating the radial field, extend from $a_0$ to $a_3$, whereas the third and fourth coils, generating the axial or longitudinal field, extend from $a_3$ to $a_2$). The dimensions $a_i$ and $b_i$ are in mm, and V is in dm³. In the most disadvantageous current configuration, the maximum value of the magnetic field reaches 5.45 T for a field of 1 T at point O.

As in the case of the first embodiment, it is possible to provide for (very complex) active shielding or passive shielding (requiring calibration of the current values).

The third embodiment of the invention allows active shielding to be achieved simply, while keeping the number of current generators equal to N/2+1. This third embodiment resembles the second in that the first and second coils, $B_n^1$ and $B_n^2$, are only used to generate a radial magnetic field, thereby allowing them to be supplied in groups of four. However, the axial magnetic field is not generated by the third and fourth coils $B_n^3$ and $B_n^4$, but by two pairs of what are called "axial" coils $PBA_1$ and $PBA_2$ having a common axis oriented in the z-direction and passing through the point O, these coils being arranged symmetrically on either side of said xy-plane. The use of two pairs of coils allows, at the same time, an axial magnetic field of the desired amplitude to be generated inside the device, the term $Z_2$ of its SHE to be cancelled out in order to improve its uniformity, and the dipolar moment to be cancelled out in order to reduce the leakage field. This result may be obtained by supplying the axial coils with currents flowing in opposite directions in each pair, and symmetrically with respect to the xy-plane. Thus, only a single current generator is necessary for the axial coils, leading to a total number of generators equal to N/2+1, as in the case of the second embodiment.

Figure 7:
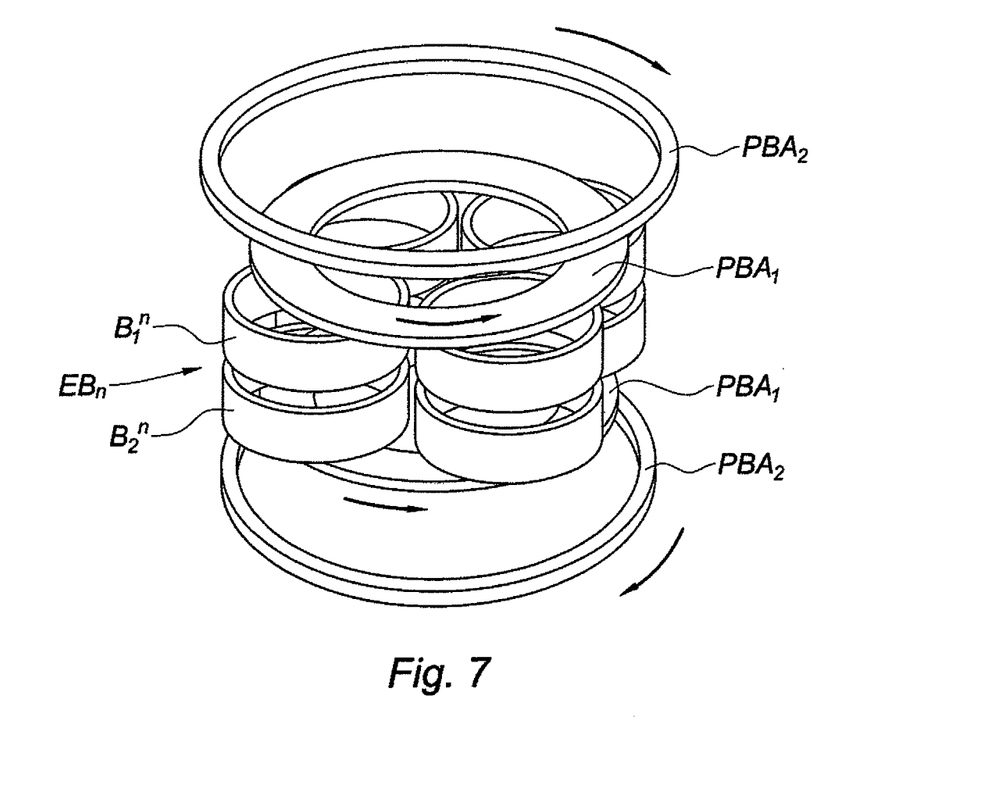
Figure 8:
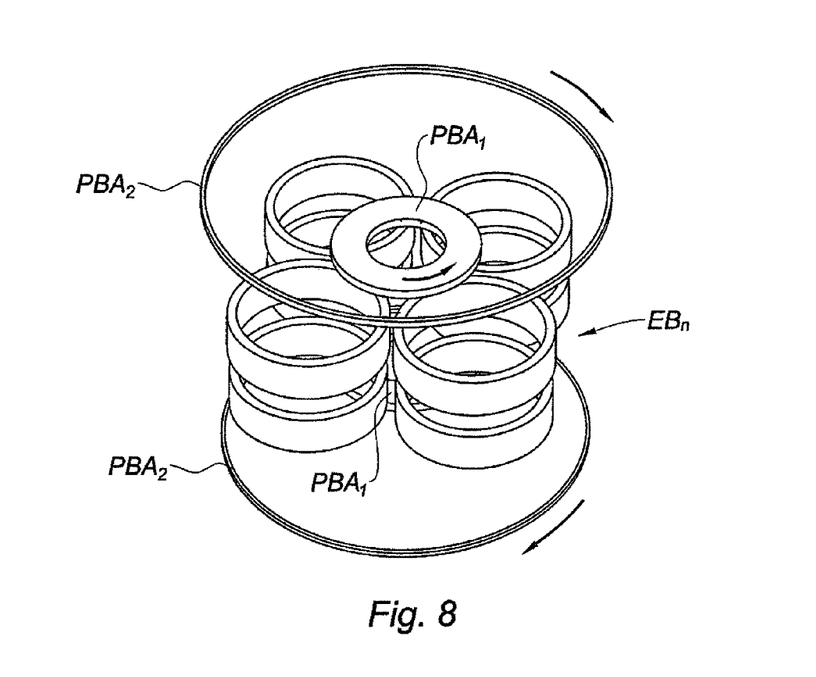
Figures 9A, 9B:
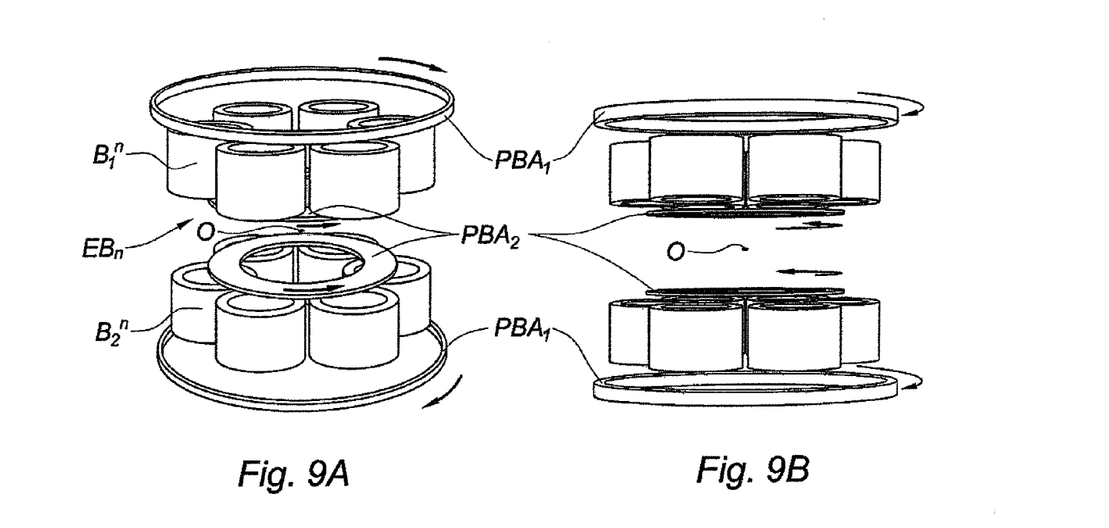

FIGS. 7, 8 and 9A/9B show three devices according to this third embodiment of the invention.

The device in FIG. 7 has coils $B_n^1$ and $B_n^2$ the geometric parameters of which are similar to those of the example in FIGS. 5A/5B:

| N | $a_0$ | $a_1$ | $a_2$ | $b_1$ | $b_2$ | V | PF | %@$r_0$ = 10 mm |
|---|---|---|---|---|---|---|---|---|
| 4 | 180 | 105 | 120 | 20 | 88.882 | 5.843 | 3.368 | 3.25 |

The dimensions $a_i$ and $b_i$ are in mm, and V is in $dm^3$. In the most disadvantageous current configuration, the maximum value of the magnetic field reaches 3.368 T for a field of 1 T at point O.

For the four axial coils:

| $a_1$ | $a_2$ | $b_1$ | $b_2$ | sgn(I) |
|---|---|---|---|---|
| 271.507 | 300 | 230.424 | 250 | − |
| 168.989 | 246.420 | 100 | 113.489 | + |
| 168.989 | 246.420 | −113.489 | −100 | + |
| 271.507 | 300 | −250 | −230.424 | − |

V = 4.729 $dm^3$ where $a_1$ and $a_2$ are defined by analogy with the coils $B_n^1$ and $B_n^2$.

The leakage field at 0.5 m from the point O is 0.0376 T for the component $B_z$ and 0.0109 T for the component $B_{xy}$. The magnitude of the leakage field would be 10 to 20 times higher in the absence of the "active shielding" provided by the axial coils.

The uniformity of the axial component $B_z$ is −9.286 ppm in the sphere of radius $r_0$=10 mm, i.e. much better than that of the radial component; the "−" sign indicates that the field decreases with distance from the centre of the sphere along the z-axis. It is therefore possible to relax the condition of zero $Z_2$ in order to minimize the volume of the axial coils. In this way, the device in FIG. 8 is obtained:

| $a_1$ | $a_2$ | $b_1$ | $b_2$ | sgn(I) |
|---|---|---|---|---|
| 295.024 | 300 | 231.577 | 250 | − |
| 60 | 115.390 | 100 | 118.435 | + |
| 60 | 115.390 | −118.435 | −100 | + |
| 295.024 | 300 | −250 | −231.577 | − |

V = 1.468 $dm^3$

The conductor volume saving is very substantial, whereas the uniformity becomes 1.63%@ $r_0$=10 mm (still better than that of the $B_{xy}$ component) and the maximum value of the magnetic field is 4.553 T. The leakage field at 0.5 m is reduced to 0.0022 T.

It is possible, a contrario, to seek a configuration that improves the uniformity of the $B_{xy}$ component, in order to bring it to a comparable level to that of the $B_z$ component, by choosing N=6 and dimensioning the coils $B_n^1$ and $B_n^2$ so as to cancel out the $Zx_2$ component of the SHE of $B_{xy}$. This optimization leads to the device in FIGS. 9A and 9B, in which the coils $B_n^1$ and $B_n^2$ are characterized by the following values:

| N | $a_0$ | $a_1$ | $a_2$ | $b_1$ | $b_2$ | V |
|---|---|---|---|---|---|---|
| 6 | 150 | 48.848 | 73 | 77.796 | 177.219 | 11.030 | for $B_0$=1 T, $j_0$=300 A/mm², and a minimum gap of 4 mm between two adjacent coils. The overall outside radius is $a_0+a_2$=223 mm, thereby allowing the overall radius of the axial coils actively compensating for the $B_z$ component to be limited to 250 mm. Moreover, $b_1$ takes a much higher value than that guaranteeing the required equatorial angular aperture; therefore it is possible to implant the pair of coaxial coils $PBA_1$ between the first and second coils.

The nonuniformity of the radial component of the magnetic field in a 10 mm-radius sphere is smaller than 3.93 ppm; the maximum value of the magnetic field is 6.521 T and the leakage field at 0.5 m is 0.0342 T.

The dimensioning of the axial coils gives:

| $a_1$ | $a_2$ | $b_1$ | $b_2$ | sgn(I) |
|---|---|---|---|---|
| 241.662 | 250 | 205.607 | 225 | − |
| 106.124 | 161.102 | 60 | 69.819 | + |
| 106.124 | 161.102 | −69.819 | −60 | + |
| 241.662 | 250 | −225 | −205.607 | − |

V = 1.406 $dm^3$

The uniformity is −2.904 ppm @$r_0$=5 mm and −46.239 ppm @$r_0$=10 mm; the maximum value of the magnetic field is 2.622 T, the leakage field at 0.5 m is 0.0101 T.

This configuration is remarkably flexible and may easily be adapted to varied constraints because the optimization codes for each of the two types of components of the field are extremely rapid (about 50 ms for each of the configurations).

If all that is required is to generate a magnetic field that is orientable in the xy-plane, the pairs of axial coils may be omitted and, if the presence of a leakage field is not a problem, a single pair of axial coils may be sufficient. It is also envisageable to combine the second and third embodiments, by adding one or two pairs of axial coils to a device according to the second embodiment of the invention.

The $I_{xy}$ component of the current supplying the first and second coils is proportional to $\cos(\phi_n-\phi_0)$, where $\phi_0$ is the azimuthal angle of the magnetic field generated. It will be understood that if $\phi_0$ is linearly variable over time ($\phi_0=\omega t$) a rotating magnetic field will be obtained in a cone of apex half-angle equal to $\theta_0$, which has applications to nuclear magnetic resonance in particular. In this case, the $I_{xy}$ component varies sinusoidally over time with an angular frequency ω. More generally, the supply current of the coils may be made to vary in a more complex way in order to generate a magnetic field of variable direction and/or amplitude.

The invention claimed is:

1. Device for generating an orientable and locally uniform magnetic field, comprising N≥3 identical assemblies ($EB_n$) of cylindrical coils, each of said assemblies comprising at least a first ($B_n^1$) and a second ($B_n^2$) coil, said coils being coaxial with an axis oriented along a direction z and being arranged symmetrically on either side of a plane xy perpendicular to said z-axis, with a gap in the axial direction, said assemblies being arranged such that their outlines in said xy-plane are regularly spaced along a circle of centre O and of radius $a_0$>0, so as to leave a central free space (ELC), the device also comprising a supply system (SA) configured to supply each of said coils with a current $I_n^i$, n being an index representing the coil assembly and i being equal to 1 for said first coils and to 2 for said second coils, expressed by the sum of a first term $I_z$ having a given value for all the coils, and a second term $I_{xy}$ equal to $(-1)^{i-1}\cdot I_0\cdot\sin\theta_0\cdot\cos(\phi_n-\phi_0)$, where $I_0$ is a nominal current, $\phi_n$ is the azimuthal angle, relative to a reference direction in the xy-plane, of the nth coil assembly, $\phi_0$ is the azimuthal angle, relative to the same reference direction, of a magnetic field to be generated in the centre of said circle by said coils, and $\theta_0$ is the zenith angle of the same magnetic field relative to the z-axis, at least the angle $\phi_0$ being adjustable by a user.

2. Device according to claim 1, in which the number N of coil assemblies is even.

3. Device according to claim 2, in which the number N of coil assemblies is chosen from 4 and 6.

4. Device according to claim 1, in which said first and second coils are identical, except, at the very most, for their winding direction.

5. Device according to claim 1, in which N is an even number higher than or equal to 6 and in which the inside diameter $a_1$, the outside diameter $a_2$, the distance $b_1$ from the xy-plane, and the height $b_2 - b_1$ of said coils are chosen so as to cancel out at least the 2nd order terms of the expansion in spherical harmonics inside an imaginary sphere located at the centre of said free space.

6. Device according to claim 1, in which said supply system is configured such that the component $I_{xy}$ of the current supplying said first and second coils is $-I_0 \cos \theta_0$, and in which the inside diameter $a_1$, the distance $b_1$ from the xy-plane and the height $b_2$ of said coils are chosen such that the radial component $B_{\rho n}$ of the magnetic field generated by the nth coil assembly is equal to twice the axial component $B_{zn}$ of this field at said centre O.

7. Device according to claim 1, in which each of said assemblies also comprises a third ($B_n^3$) and a fourth ($B_n^4$) cylindrical coil coaxial with said first and second coils, and being arranged symmetrically on either side of said plane with a gap in the axial direction; and in which said supply system is configured such that the component $I_z$ of the current supplying said first and second coils is zero; and the current supplying said third and fourth coils of all the assemblies is $I_{3,4} = -I_0 \cos \theta_0$.

8. Device according to claim 7, in which said third and fourth coils are wound inside the first and second coils of the corresponding assemblies.

9. Device according to claim 7, in which said third and fourth coils are remote further from the xy-plane than the first and second coils of the corresponding assemblies.

10. Device according to claim 1, also comprising a first (PBA1) and a second (PBA2) pair of coaxial cylindrical coils having a common axis oriented in said z-direction and passing through the centre of said circle, the coils being arranged symmetrically on either side of said xy-plane; said supply system is configured such that the component $I_z$ of the supply current of said first and second coils is zero; and currents flow through said two pairs of coils in opposite directions in each pair, the currents having values allowing both the dipolar magnetic moment outside of the device to be cancelled out, and the magnetic field generated by all the coils of the device at the centre of said circle to be oriented at a zenith angle $\theta_0$.

11. Device according to claim 10, in which the diameters, heights and axial positions of the coils of said two pairs are chosen so as also to cancel out at least the 1st and 2nd order terms of the expansion in spherical harmonics of the component oriented in said z-direction of said magnetic field inside an imaginary sphere located at the centre of said free space.

12. Device according to claim 10, in which one of said pairs of coils is arranged in the gap between said first and second coils, and the other pair is arranged externally to said first and second coils in said z-direction.

13. Device according to claim 7, in which N is an even number and the first and second coils of the assemblies arranged symmetrically relative to the centre of said circle are connected in series with one another and to a common current generator.

14. Device according to claim 1, in which said coils have uniform average winding densities.

15. Device according to claim 1, in which said supply system is configured to supply said first and second coils with a current varying sinusoidally over time, by way of which a rotating magnetic field is generated in said central free space.

* * * * *

UNITED STATES PATENT AND TRADEMARK OFFICE
CERTIFICATE OF CORRECTION

| | | |
|---|---|---|
| PATENT NO. | : 8,902,030 B2 | Page 1 of 1 |
| APPLICATION NO. | : 14/105711 | |
| DATED | : December 2, 2014 | |
| INVENTOR(S) | : Aubert | |

It is certified that error appears in the above-identified patent and that said Letters Patent is hereby corrected as shown below:

Title page,
Item (72) Inventor: "Poiters (FR)" should read --Poitiers (FR)--.

Signed and Sealed this
Fourteenth Day of April, 2015

Michelle K. Lee
*Director of the United States Patent and Trademark Office*